(12) United States Patent
Goel et al.

(10) Patent No.: US 7,206,919 B2
(45) Date of Patent: Apr. 17, 2007

(54) RAPID PARTIAL CONFIGURATION OF RECONFIGURABLE DEVICES

(75) Inventors: Ashish Kumar Goel, Varanasi (IN); Manish Agarwal, Lucknow (IN)

(73) Assignee: STMicroelectronics Pvt. Ltd. (IN)

( * ) Notice: Subject to any disclaimer, the term of this patent is extended or adjusted under 35 U.S.C. 154(b) by 312 days.

(21) Appl. No.: 10/319,436

(22) Filed: Dec. 13, 2002

(65) Prior Publication Data

US 2003/0145193 A1 Jul. 31, 2003

(30) Foreign Application Priority Data

Dec. 14, 2001 (IN) .................. 1245/DEL/2001

(51) Int. Cl.
*G06F 12/00* (2006.01)
*G06F 13/00* (2006.01)

(52) U.S. Cl. .................. 711/220; 711/100; 711/154; 711/200; 365/189.01

(58) Field of Classification Search ............... 713/401; 714/37, 819, 49; 711/220, 100, 154, 200; 365/189.04, 201, 230.05, 189.07, 218, 230.08; 326/40, 39, 38; 700/3; 710/100, 51; 712/23; 370/392

See application file for complete search history.

(56) References Cited

U.S. PATENT DOCUMENTS

| 5,095,483 | A | * | 3/1992 | Dubler et al. .................. 714/36 |
| 5,430,687 | A | * | 7/1995 | Hung et al. ............ 365/230.08 |
| 5,781,756 | A | | 7/1998 | Hung |
| 6,057,704 | A | * | 5/2000 | New et al. ..................... 326/38 |
| 6,785,284 | B1 | * | 8/2004 | Hagen ..................... 370/395.5 |
| 7,043,569 | B1 | * | 5/2006 | Chou et al. ................... 710/8 |

* cited by examiner

*Primary Examiner*—Tuan V. Thai
(74) *Attorney, Agent, or Firm*—Lisa K. Jorgenson; J. Mark Han; Graybeal Jackson Haley LLP

(57) ABSTRACT

A system and method for enabling rapid partial configuration of reconfigurable devices includes a configuration definition unit and a configuration loading unit. The configuration definition unit defines partial configuration requirements, and contains at least a starting address of configuration data for the partial reconfiguration, data size specifying the number of contiguous locations to be reconfigured, and desired configuration data corresponding to the contiguous locations. The configuration loading unit provides for loading the configuration data into the reconfigurable device according to the partial configuration requirements without providing commands corresponding to any addresses outside of said configuration requirements.

34 Claims, 10 Drawing Sheets

RAPID PARTIAL CONFIGURATION OF RECONFIGURABLE DEVICES

PRIORITY CLAIM

This application claims priority from Indian patent application No. 1245/Del/2001, filed Dec. 14, 2001, which is incorporated herein by reference.

TECHNICAL FIELD

The present invention relates generally to a method and system for enabling rapid partial configuration of reconfigurable devices.

BACKGROUND

An FPGA (field-programmable gate array) typically includes configuration memory cells, configuration control elements and a matrix of logic blocks and I/O blocks. The configuration control elements are usually latches forming a configuration latch matrix.

FIG. 1 shows the scheme of a known configuration latch matrix usable in a FPGA. Here, configuration frames are loaded into a frame register 110. A horizontal latch array 100 has outputs 101 and 102 supplying write enable signals to latch columns 131 and, respectively, 132.

When either write enable signal goes high, data present on data lines 111 are loaded into a selected latch column. If write enable output 101 is high then data is loaded into the latch column 131 and if enable output 102 is high then data is loaded into the latch column 132.

FIG. 2 of the accompanying drawings shows the flow diagram for a partial configuration method as described in U.S. Pat. No. 5,781,756. The method includes the following steps:

After the start of frame loading, checking for the end of the bit stream (2.1). If it is not the end of bit stream, retrieving a packet from the bit stream (2.2), checking whether the packet is a skip command or a write command (2.3). If the packet is a skip command, just increasing the address of the memory latch column, and retrieving the next frame (2.6). If it is write command, storing the bit stream in a data register (2.4), strobing the address register to load the data into memory cells (2.5) and incrementing the address (2.6). This process goes on until the end of the bit stream.

Problem with this approach is that if we need to load only few frames, even then we need to load skip or write commands for all the frames. In this case there will be many skip commands. Again if most of the frames are to be loaded again, then there will be write commands or skip commands for all the frames. In this case there will be more write command. It will cause a large configuration time.

SUMMARY

In one aspect of the invention, the above drawbacks are obviated by enabling rapid partial configuration of reconfigurable devices.

To achieve this, a system is provided for enabling rapid partial configuration of reconfigurable devices, comprising:
configuration definition means for defining a partial configuration requirements, including at least the following:
starting address of configuration data for said partial reconfiguration,
an information indicative of an end of said configuration data to be loaded in contiguous locations,
desired configuration data corresponding to said contiguous locations,
configuration loading means for loading the configuration data according to said partial configuration requirements.

The configuration definition means is a data frame and said starting address, the information and said desired configuration data are elements of said data frame.

The configuration means comprises:
an address counter means for storing said starting address of configuration data,
index counter means for storing a data size,
configuring means for loading configuration data according to said partial configuration data, the arrangement being such that after loading each configuration data, said address counter means is incremented, while said index counter means is decremented, said sequence continuing until said index counter value reaches zero.

The data frame is stored in a frame register while said address is stored in an address counter connected to the input of a decoder which controls a horizontal latch array and said configuration data is loaded into the selected latch column.

The starting address of said configuration means corresponds to the address of the initial configuration latch column and said data size of said configuration means corresponds to number of contiguous latch columns.

The address counter means stores a starting latch column address and said index counter means stores the number of contiguous latch columns.

The system includes:
a controller to control the loading of the data into said index counter and address counter, wherein
an output of the address counter is connected to a decoder circuit,
said decoder circuit output enables the loading of column latch data into a selected configuration memory column.

Another aspect of the invention further provides a method for enabling rapid partial configuration of a reconfigurable device, comprising the steps of:
defining partial configuration requirements including at least the following:
starting address of configuration data for said partial reconfiguration,
an information indicative of an end of said configuration data to be loaded in contiguous locations,
desired configuration data corresponding to said contiguous locations, and
performing the configuration according to said partial configuration requirements.

The partial configuration requirements are defined as a data frame and said starting address, said information and said desired configuration data are fields of said data frame.

The configuration is performed by:
storing said starting address of configuration data in an address counter,
storing a data size in an index counter,
storing said configuration data in the configuration memory of said configurable device at the stored address, incrementing said address counter and decrementing said index counter storing each configuration data element, said sequence continuing until said index counter value reaches zero.

The starting address of said configuration means corresponds to the address of the initial configuration latch column and said data size of said configuration means corresponds to the number of contiguous latch columns.

The address counter stores a starting latch column address and said data size corresponds to the number of contiguous latch columns.

DETAILED DESCRIPTION

Figure 3:
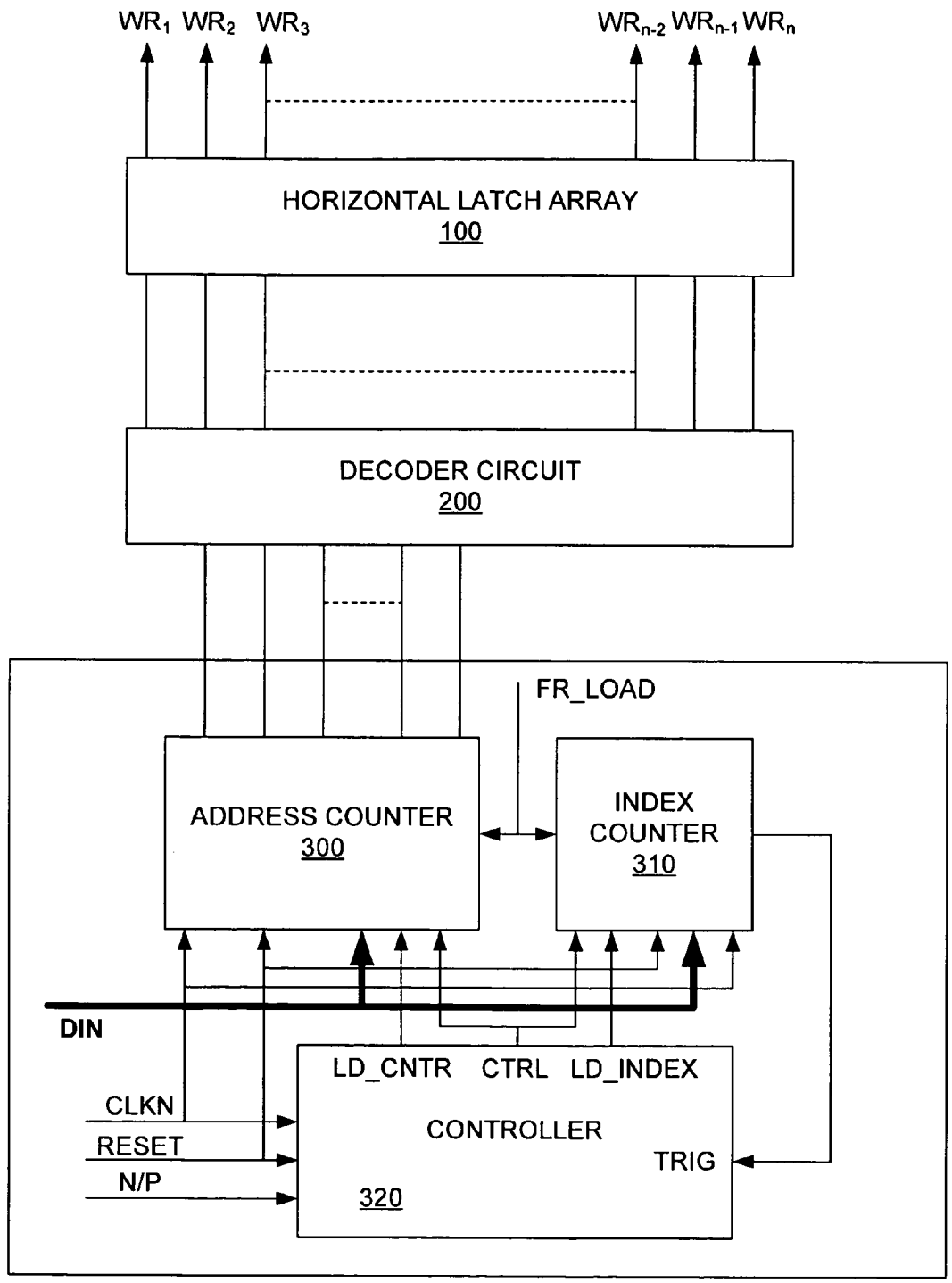
FIG. 3 is a block diagram of a partial reconfiguration unit of reconfigurable devices according to an embodiment of this invention.

FIG. 3 shows the block diagram of an embodiment of the reconfiguration unit according to an embodiment of the present invention.

The reconfiguration unit comprises an address counter 300, an index counter 310, and a controller 320.

Address counter 300 is used to store the address of the frame.

Figure 1:
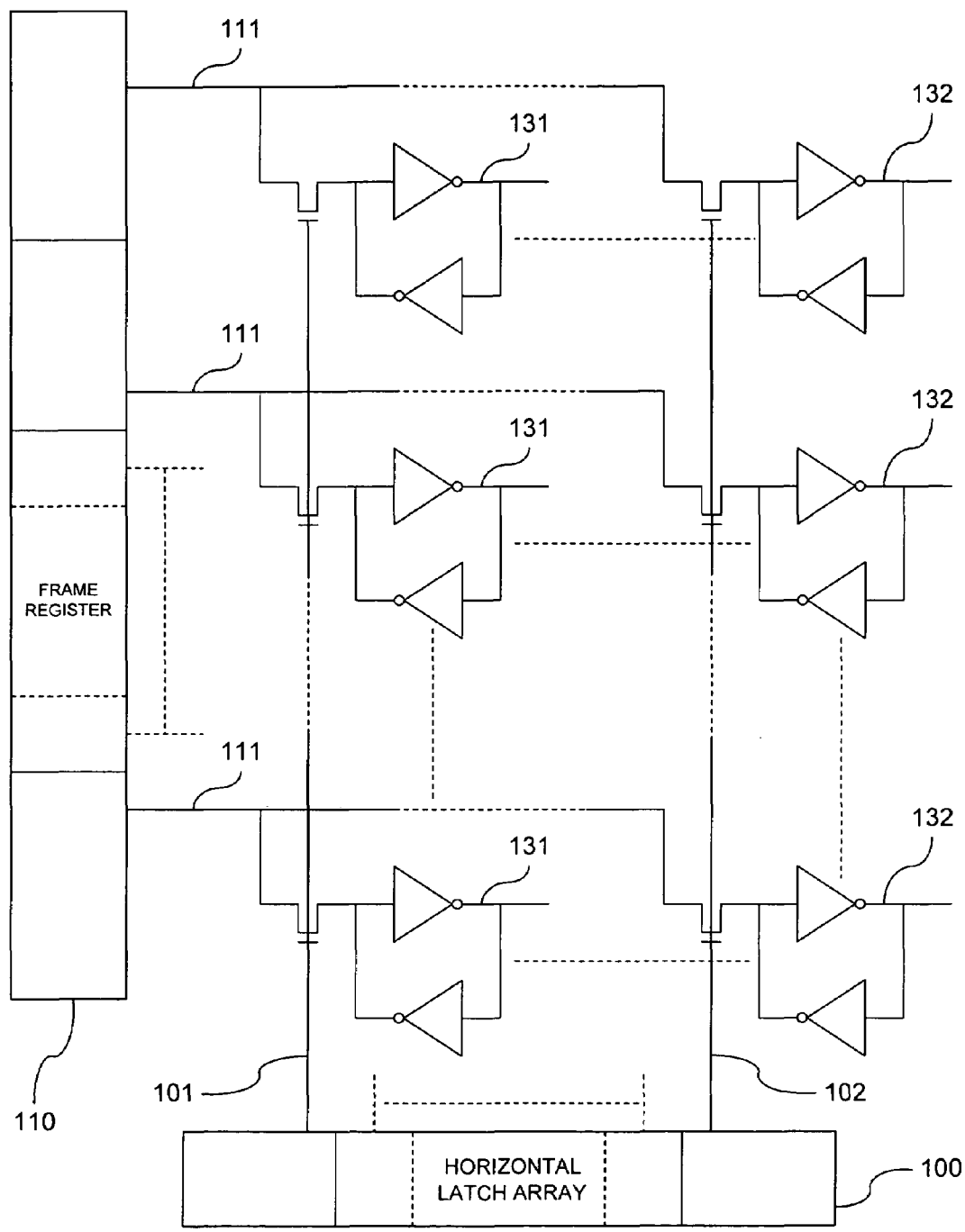
FIG. 1 shows a known configuration latch matrix with frame register and horizontal latch array.
Figure 2:
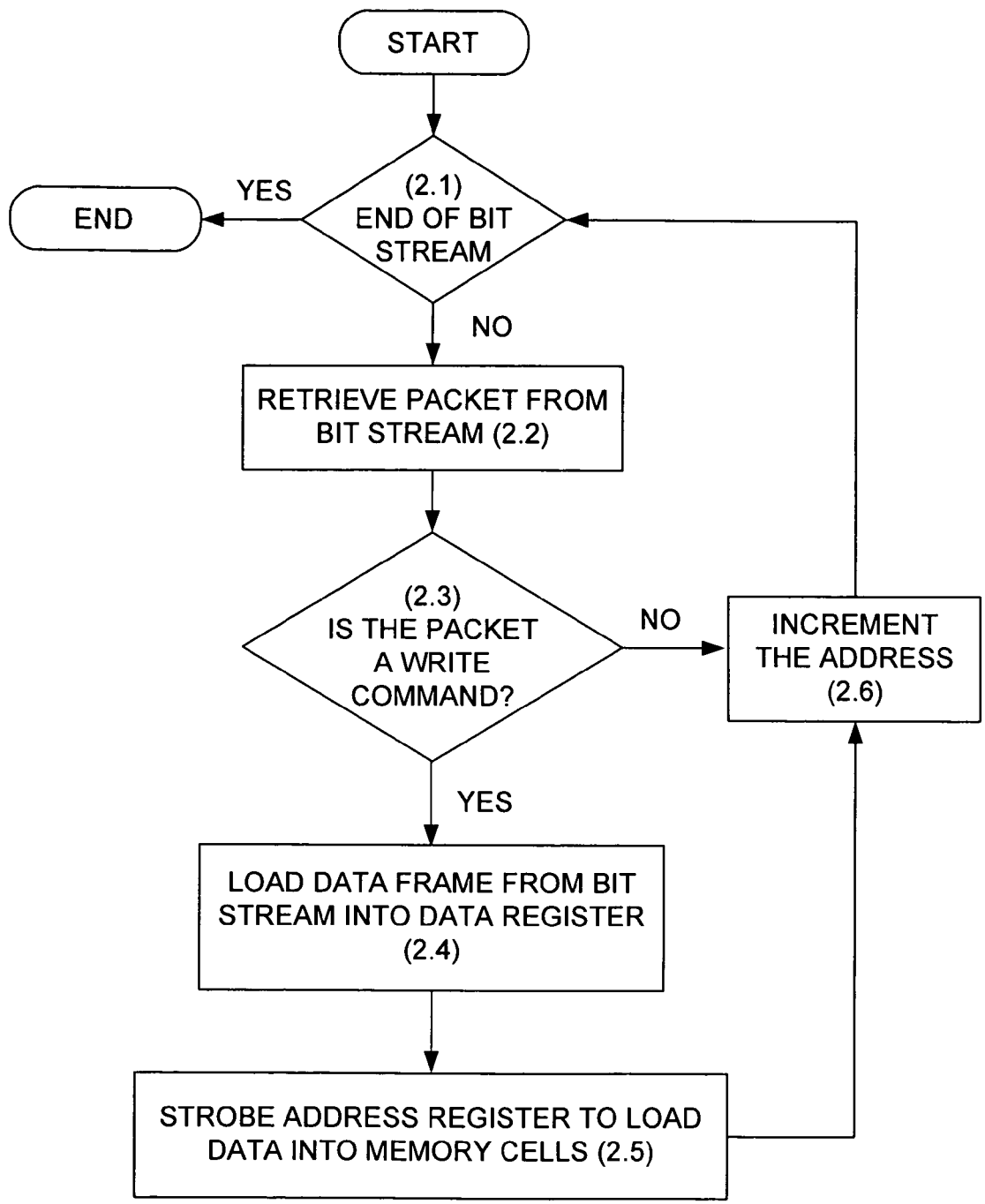
FIG. 2 shows the flow-chart of a prior art partial reconfiguration method.

Index counter 310 is used to store number of frames to be loaded in continuation during the partial configuration. During normal configuration the index counter 310 remains idle. Controller 320 is used to control the loading of the data into the index counter 310 and address counter 300. The outputs of the address counter 300 are connected to a decoder circuit 200. Decoder circuit 200 decodes the address supplied by address counter 300 and only one output of the decoder circuit 200 goes high. The outputs of the decoder circuit 200 are connected to the horizontal latch array 100, which checks the value specified by the decoder circuit 200 only after a complete frame is loaded into the frame register (110 in FIG. 1).

During a first time of configuration or full configuration, the configuration is done as for prior normal operation. After loading the pre-configuration data, frame data are shifted into the frame register 110. Once the complete frame is loaded, horizontal latch array 100 (FIG. 1) takes the decoder output and the frame is loaded in the specified latch column.

The address stored in the address counter 300 is then incremented and the next frame is loaded into the new address. Referring to FIG. 3, during the normal operation, address counter 300 works as a simple up-counter and the frames are loaded one by one. Index counter 310 remains idle.

During partial configuration, after a pre-configuration frame is loaded, next data DIN is loaded into the index counter 310 and then to address counter 300. The value of index counter 310 shows the number of frames to be stored in sequence and the value of address counter 300 shows the starting frame address. Decoder circuit 200 decodes this address and the specified output of the decoder circuit 200 goes high. But the output of the horizontal latch array 100 will not go high until the complete frame is loaded into the frame register. Now the next data, which are frame data, are shifted into the frame register. Once a complete frame is loaded, horizontal latch array 100 takes the decoder output and the frame is loaded in that particular latch column whose address is represented by the address counter 300. Then, the value of address counter 300 is incremented, the index counter 310 is decremented; and the next frame is loaded into this new address. Address counter 300 is again incremented and index counter 310 decremented after the frame is loaded.

When the content of the index counter 310 value goes to 0, it means that all the consecutive frames have been loaded. Then, index counter 310 triggers the controller 320, which enables loading of new index counter and address counter values. Then, the next coming frames are loaded starting from this new address. When configuration is completed, start up sequence starts and the device comes into the operational state.

Figure 4:
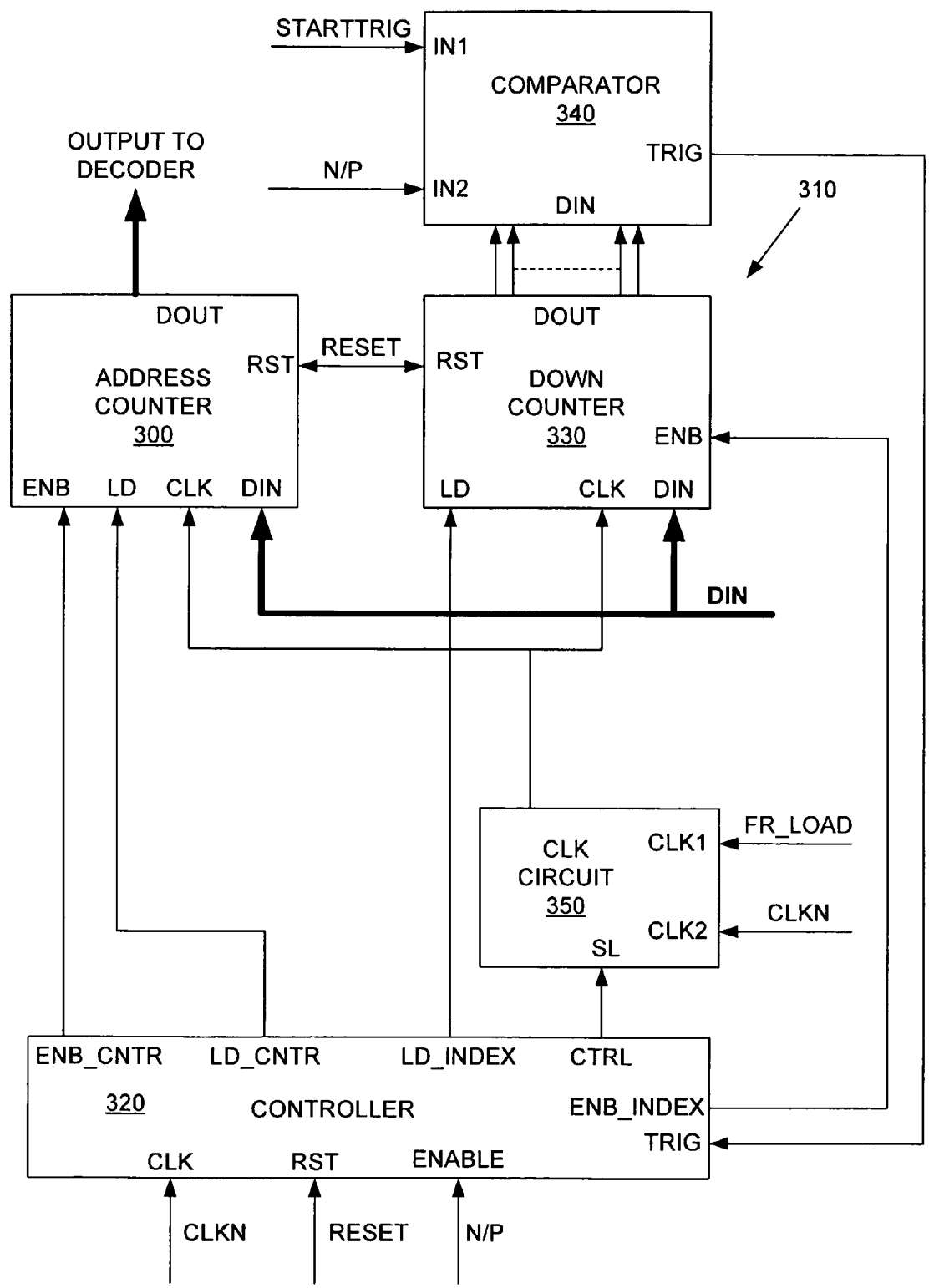
FIG. 4 shows a more detailed diagram of the partial reconfiguration unit for reconfigurable devices, according to an embodiment of this invention.

FIG. 4 shows a more detailed scheme of the reconfiguration unit of FIG. 3 according to an embodiment of the invention. The index counter 310 is shown here as formed by a down counter 330 and a comparator 340. Comparator 340 generates a high pulse on output TRIG when the output of the down counter 330 reaches 0 and signal N/P is 0 or when STARTTRIG goes high and signal N/P is 0. Signal NIP remains high in case of normal configuration and 0 in case of partial configuration. There is no strict requirement of the indicated levels. It will change only the comparator design. There is no strict requirement of the TRIG signal to go high if index counter value is 0 or STARTTRIG goes high in case of NIP signal is 0. TRIG also can go low, but in case CONTROLLER will be activated on TRIG low not on TRIG high.

During normal configuration (full configuration) signal NIP is high. In this case output ENB_INDEX of the controller 320 is 0 and disables the index counter 310, which remains in idle state. ENB_CNTR remains high which makes the address counter 300 to work as an up-counter. Output TRIG of comparator 340 remains 0 and causes the signals CTRL, LD_CNTR and LD_INDEX to remain low.

A CLK circuit 350 selects the clock for the address counter 300 and index counter 310. When signal CTRL is low, data load clock FR_LOAD is selected, otherwise configuration clock CLKN is selected. After one frame is loaded in the configuration latches, clock FR_Load causes the address counter 300 to increment its value and index counter 310 to decrement its value when selected.

Figure 5:
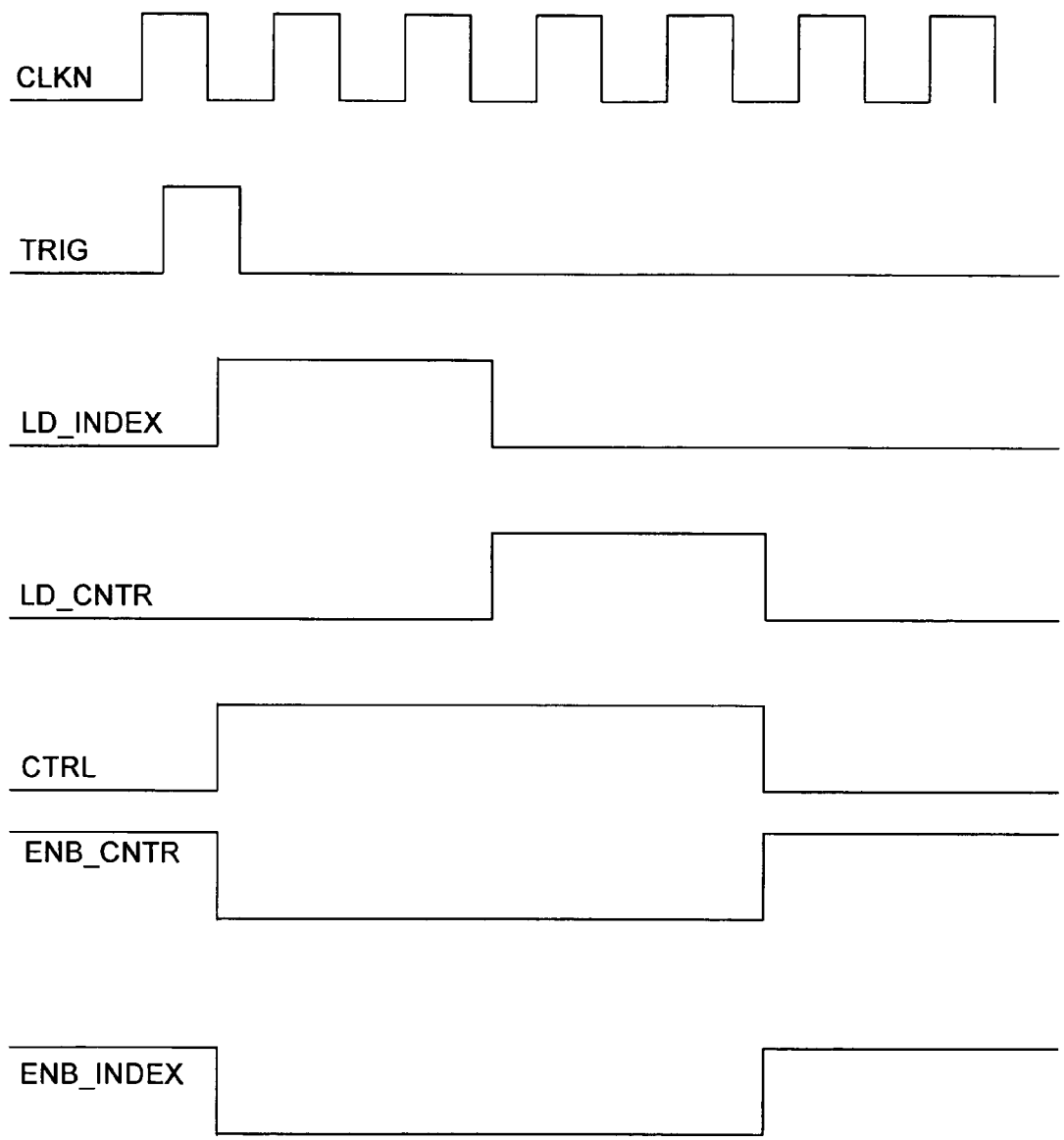
FIG. 5 shows the plot of signals of the unity of FIG. 4 during partial configuration according to an embodiment of the invention.

Before proceeding to the partial configuration operation in FIG. 4, let us see in FIG. 5 the controller 320 outputs according to an embodiment of the invention FIG. Controller 320 checks the signal TRIG at the negative or falling edge of signal clock CLKN. If signal TRIG is high, controller 320 generates the signals LD_INDEX, LD_CNTR, and CTRL as shown. LD_CNTR is the load signal to the address counter 300 and LD_INDEX is the load signal to the index counter 310. In this particular embodiment, index and address counters 310, 300 are assumed to be 16 bit and data is coming in bytes. So two clock cycles will be required to load index counter 310 and two clock cycles for address counter 300. Signal CTRL remains high during the loading of the data. When signal CTRL is high, signals ENB_INDEX and ENB_CNTR remain low, so as to disable index counter 310 and address counter 300 from decrementing or incrementing their values during the loading of the data.

Coming back to the FIG. 4, in partial configuration signal N/P remains 0. If either the STARTTRIG goes high or the output of down counter 330 goes to 0, TRIG goes high. STARTTRIG is used for enabling loading of the index counter 310 and address counter 300 the first time after pre-configuration frame has been loaded. STARTTRIG is an internally generated signal after the pre-configuration frame. As TRIG goes high, then at negative or falling edge of the clock CLKN, signals CTRL and LD_INDEX go high. Signal CTRL remains high during the loading of the reconfiguration data and disables the index counter 310 and address counter 300 from decrementing or incrementing their value during the loading of the reconfiguration data. It also selects the configuration clock CLKN during the loading of the frame. After CTRL goes high, then at next two positive or leading edges of CLKN, reconfiguration data coming from DIN are loaded into the index counter 310 and then at next two positive edges of CLKN, reconfiguration data are loaded into the address counter 300. While the reconfiguration data are loaded into the index counter 310, TRIG goes low.

After the reconfiguration data have been loaded into the index counter 310 and address counter 300, then at the next negative edge of CLKN, CTRL goes low. Now clock FR_LOAD is selected by signal CTRL and supplied to index counter 310 and address counter 300.

Figure 6:
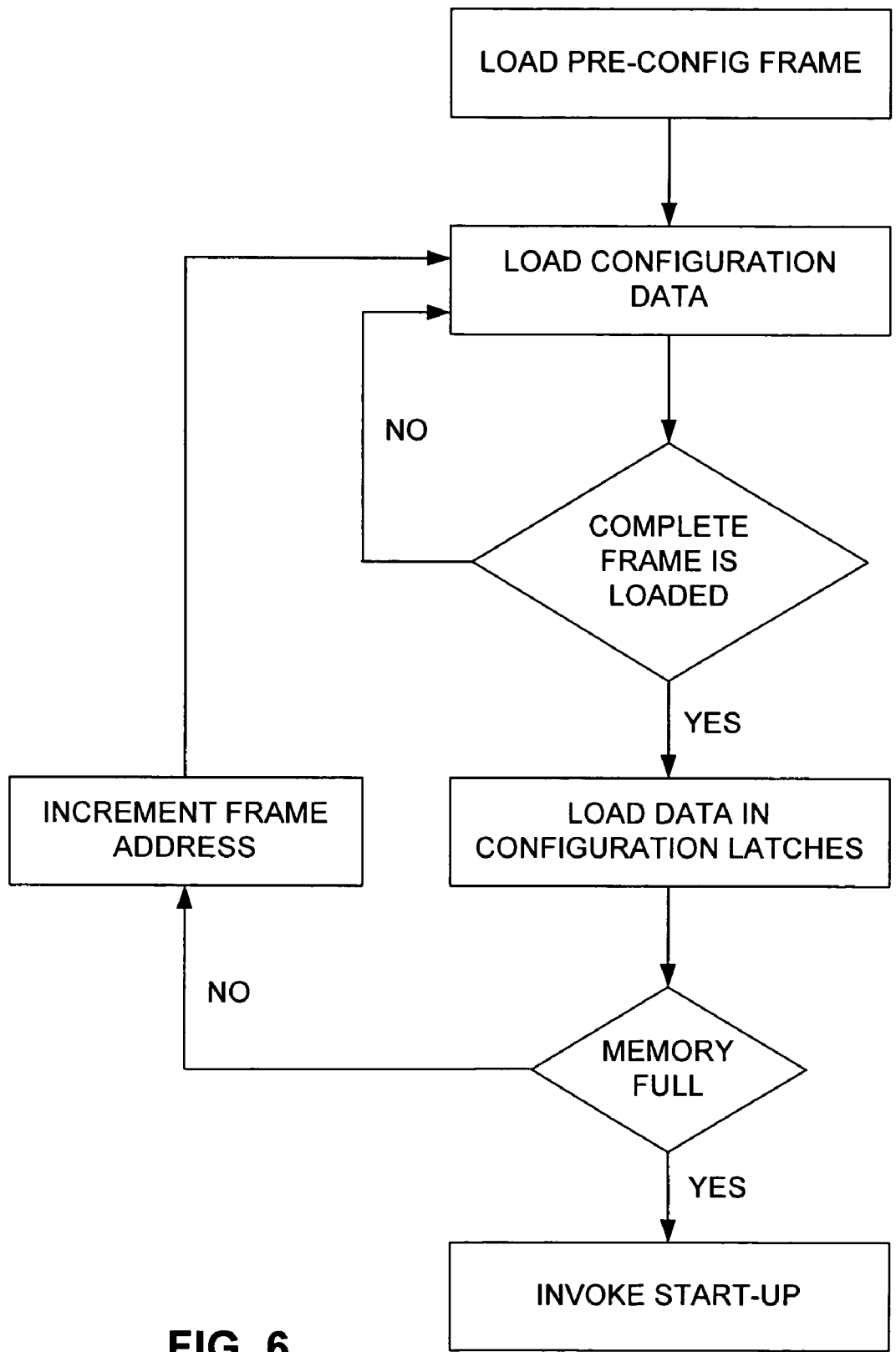
FIG. 6 is the flow diagram for a normal configuration according to an embodiment of the invention.

FIG. 6 shows the flow of frame loading in the normal (full) configuration mode according to an embodiment of the invention. After loading the pre-configuration frame, configuration data is loaded into the frame register (110 in FIG. 1). When a complete frame is loaded, the frame is shifted into the configuration latches. Now a general control unit (not shown) checks whether all the frames have been loaded or not. If all the frames have been loaded (Memory Full) start-up is requested, otherwise, the frame address is incremented, a new frame is loaded into the frame register and this process goes on until all the frames have been loaded.

Figure 7A:
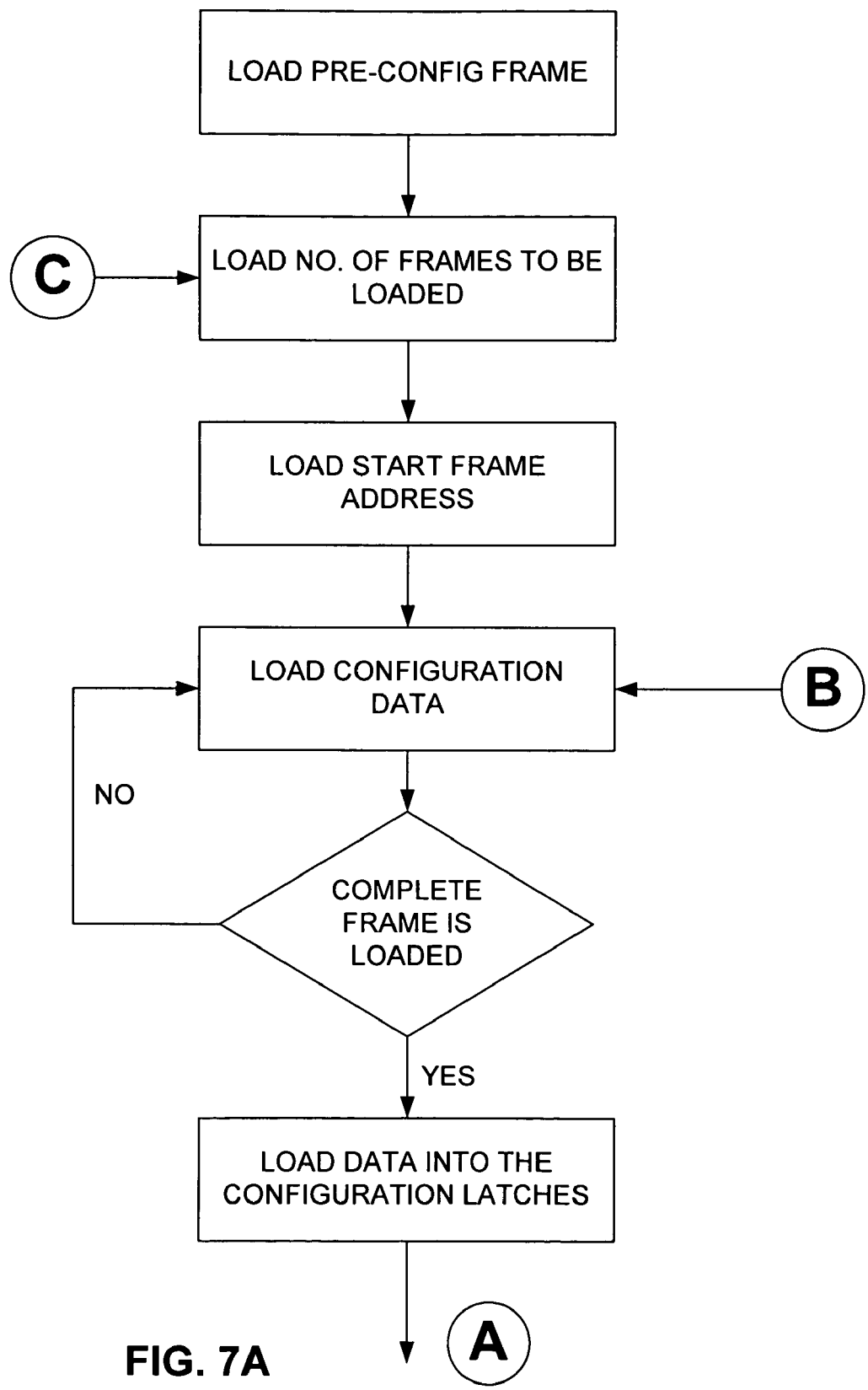
FIGS. 7a and 7b show the flow diagram for the partial configuration method according to an embodiment of the invention.
Figure 7B:
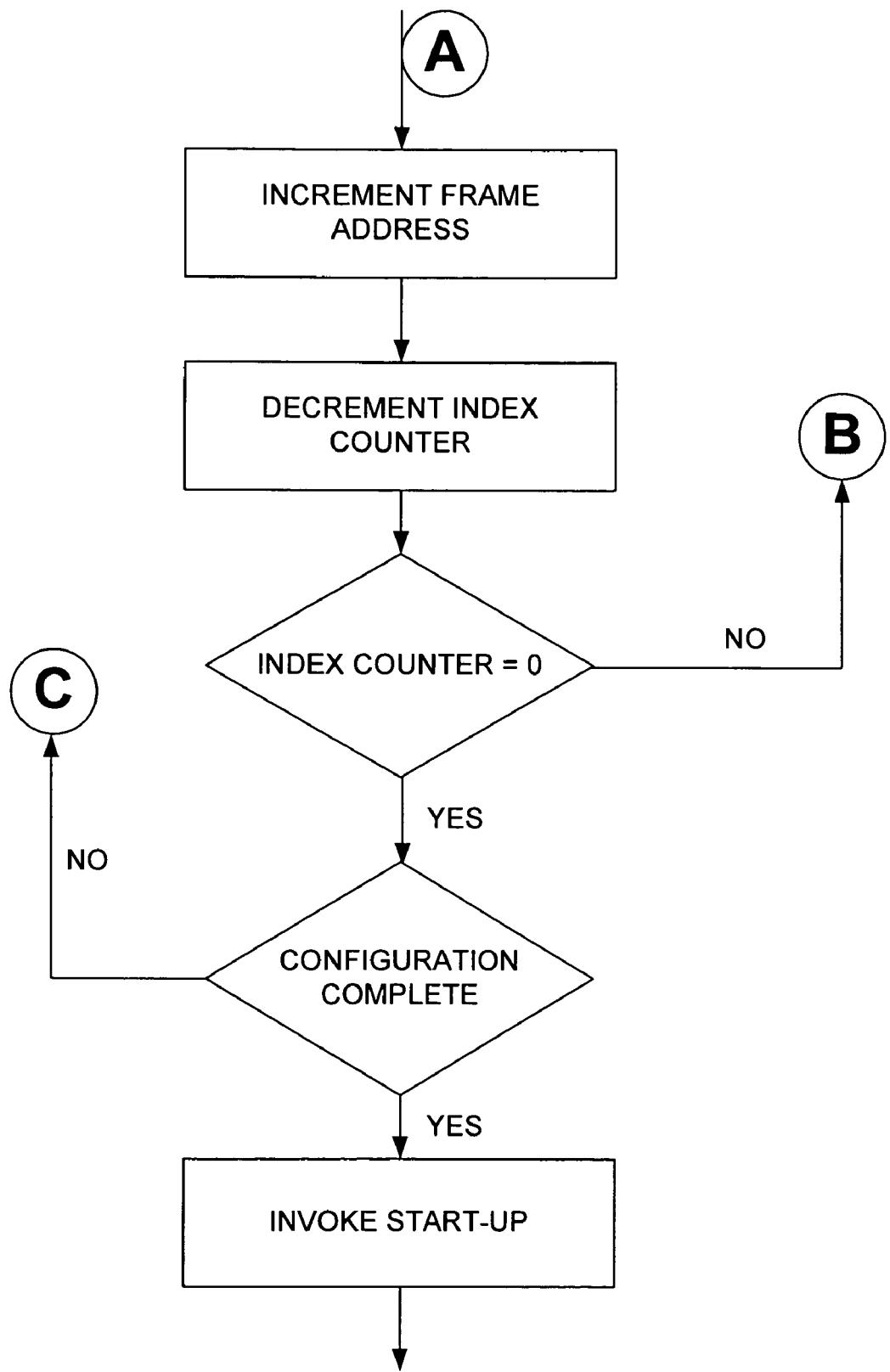

FIGS. 7a and 7b show the flow of frame loading in the partial configuration mode according to an embodiment of the invention. After loading the pre-configuration frame, the number of consecutive frames are loaded in index counter 310, then the starting frame address is loaded in the address counter 300. After that, configuration data are loaded into the frame register. When a complete frame has been loaded, it is shifted into the configuration latches. Now address counter 300 value is incremented (Frame address value) and the index counter value is decremented. Thereafter, index counter value is checked. If it is not equal to 0, then a new frame is loaded in the frame register and shifted to the configuration latches. Again the address counter value is incremented and the index counter value is decremented. This process goes on until the index counter value is equal to 0. When index counter value goes to 0, it is checked whether all the frames have been loaded or not. If all the frames have been loaded (Configuration is complete) then start-up is invoked, otherwise a new index counter value and a new address counter (frame address) value is loaded. The index counter value represents the number of consecutive frames starting with this new frame address value. Now the next frame is loaded and shifted into the configuration latch column whose address is decoded by the address counter value. Again, the address counter value is incremented and the index counter value is decremented. This process goes on until the complete configuration is completed.

Figure 8A:
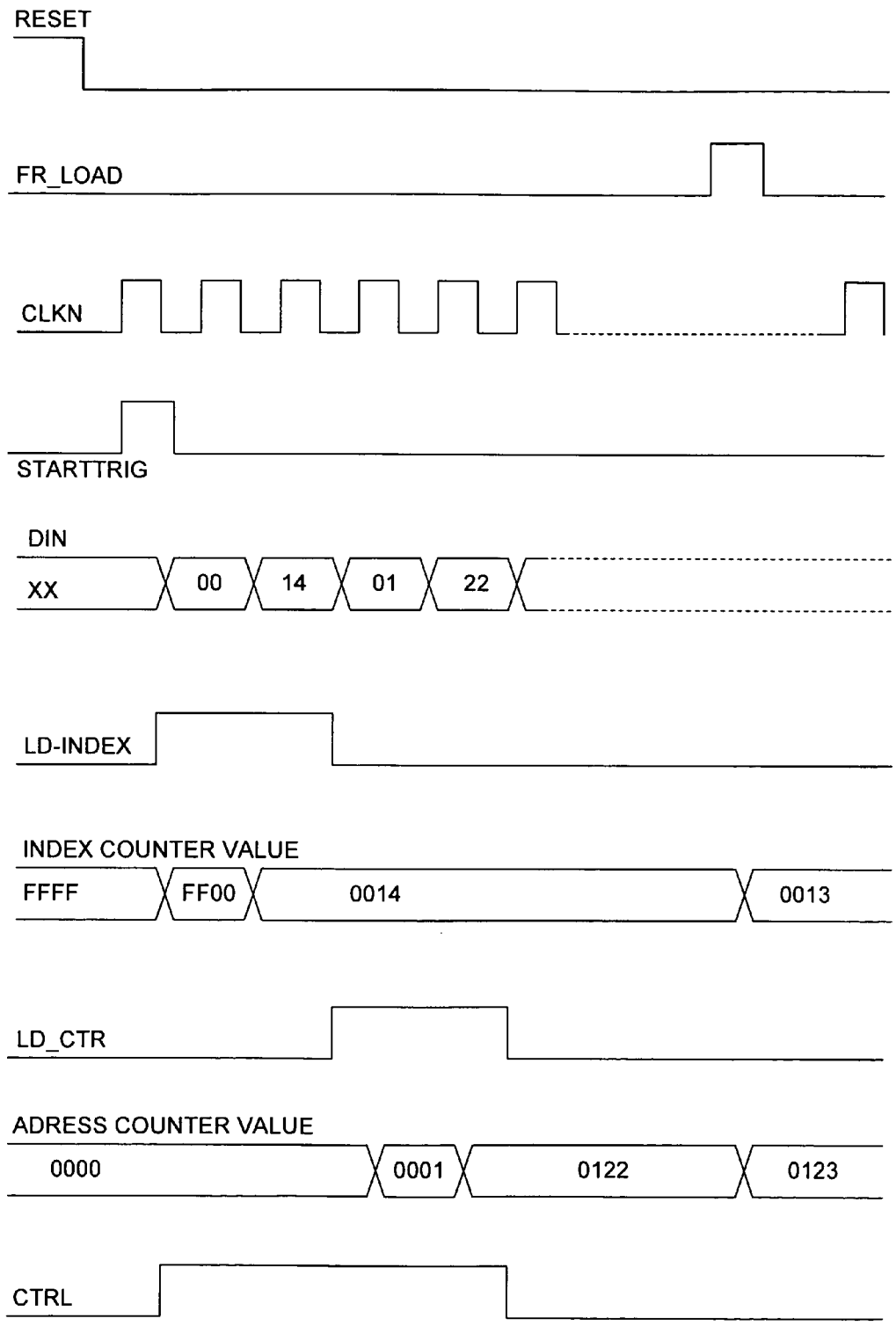
FIG. 8a shows the waveform of signals for partial configuration in a first condition according to an embodiment of the invention.
Figure 8B:
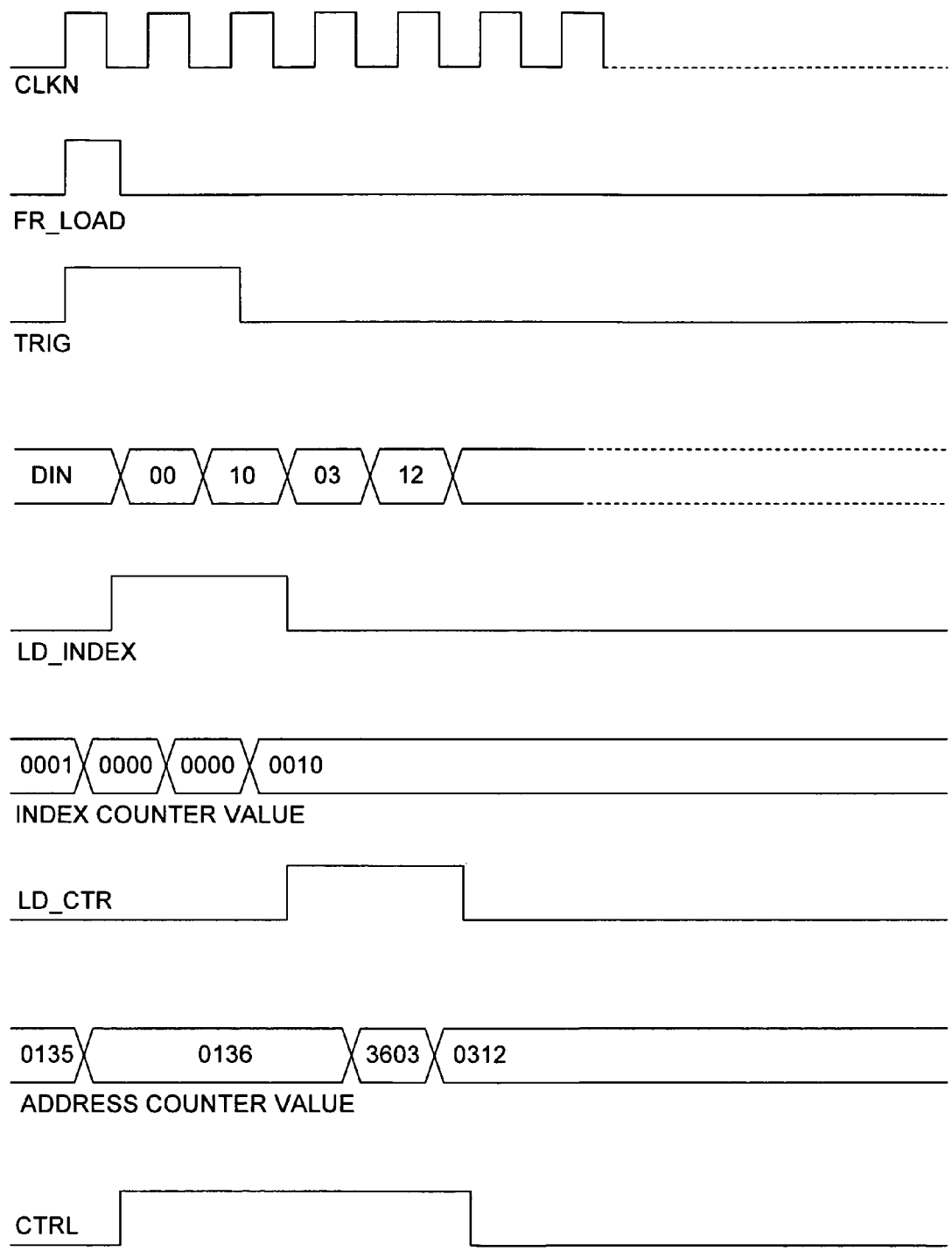
FIG. 8b shows the waveform for partial configuration in a second condition according to an embodiment of the invention.

FIG. 8a and FIG. 8b show the waveforms for the partial configuration according to an embodiment of the invention. FIG. 8a shows the waveform at the start of the configuration when STARTTRIG comes after the loading of the pre-configuration frame. Initially, after reset, the value of the index counter 310 is a string of all 1 and the value of the address counter is a string of all 0. After STARTTRIG goes high, at the next negative edge of the clock (CLKN), signals LD_INDEX and CTRL go high. When signal CTRL is high, CLKN is selected as the clock of the index counter 310 and the address counter 300, otherwise FR_LOAD is selected. At the next two positive edges of CLKN, data are loaded into the index counter 310. DIN is loaded into the LSB byte of the index counter 310 and LSB byte is shifted into the MSB byte of the index counter 310. Suppose we want to load 0014h in the index counter 310; then at the first positive edge of CLKN, DIN value will be 00h and at the next positive edge DIN value will be 14h.

Now at the next negative edge of the CLKN, LD_CTR goes high and LD_INDEX goes low. Then at the next two positive edges of the CLKN, data is loaded into the address counter 300. Data is loaded into the address counter 300 from DIN in the same manner as in the index counter 310. Suppose we want to load 0122h in the address counter 300 as the starting address, then at first positive edge of CLKN, DIN value will be 01h and at next positive edge, DIN value will be 22h.

Now at the next negative edge of the CLKN, LD_CTR and CTRL will go low. Now FR_LOAD is selected as the clock for the index counter 310 and the address counter 300. When the positive edge of the FR_LOAD comes (after one complete frame is loaded into the frame register 110 of FIG. 1 and shifted into the configuration latch column), index counter value is decremented and the address counter value is incremented.

FIG. 8b shows the waveform for partial configuration when, at the positive edge of the FR_LOAD, the index counter value goes to 0 (here we assume that the positive edge of FR_LOAD is in synchronization with the positive edge of CLKN). As the index counter value goes to all 0, TRIG goes high and at next negative edge of the clock CLKN, CTRL and LD_INDEX go high and again new index counter and address counter values are loaded as in the previous case (FIG. 8a). This time TRIG goes low as the index counter value changes from all 0 to any other new value. Since at least one frame will be loaded starting from the new address which will be loaded in the address counter, the minimum value which will be loaded in the index counter will be 0001h.

In this particular case, output of the controller 320 is as shown in the FIG. 5. But in general case the output LD_INDEX will remain high for the clock pulses taken by index counter 310 for loading the new data and LD_CTR will remain high for the clock pulses taken by address counter 300 for loading the new data. Output CTRL will remain high throughout the loading of the address counter 300 and index counter 310.

It will be apparent to those with ordinary skill in the art that the foregoing is merely illustrative and is not intended to be exhaustive or limiting, having been presented by way of example only and that various modifications can be made within the scope of the invention.

Accordingly, this invention is not to be considered limited to the specific examples chosen for purposes of disclosure, but rather to cover all changes and modifications, which do not constitute departures from the scope of the present invention. For example, the reconfiguration data may comprise, instead of the number of sequential frames to be loaded during partial configuration, the end address of the configuration data of the partial configuration or any other information indicative of when consecutive storing of configuration data is to be ended.

What is claimed is:

1. A system for enabling rapid partial configuration of reconfigurable devices comprising:
    configuration definition means for defining partial configuration requirements, containing at least the following:
    a starting address of configuration data for said partial reconfiguration,
    an information indicative of an end of said configuration data to be loaded in contiguous locations,
    desired configuration data corresponding to said contiguous locations,
    configuration loading means for loading the desired configuration data according to said partial configuration requirements without providing skip commands;
    wherein the configuration loading means comprises: an address counter means for storing said starting address of configuration data, an index counter means for storing a number of frames to be loaded, configuring means for loading configuration data according to said partial configuration data, said configuring means comprising means for incrementing said address counter means after loading each configuration data, means for decrementing said index counter means, and means for continued enabling of said means for incrementing and said means for decrementing until said index counter value reaches zero.

2. A system as claimed in claim 1, wherein said configuration definition means is a data frame and said starting address, said information and said desired configuration data are elements of said data frame.

3. A system as claimed in claim 2, comprising a frame register for storing said data frame, and an address counter storing said address and having an output connected to a decoder which selects a particular row/column to be configured of an associated configuration memory.

4. A system as claimed in claim 1, wherein said information is a data size specifying a number of said contiguous locations.

5. A system as claimed in claim 1, wherein said information is an end address of the configuration data for said partial configuration.

6. A system as claimed in claim 1, wherein said starting address of said configuration definition means corresponds to the address of an initial configuration latch column and said information corresponds to a number of contiguous latch columns.

7. A system as claimed in claim 1, wherein said address counter means stores a starting latch column address and said index counter means stores a number of contiguous latch columns.

8. A system as claimed in claim 7, including:
    a controller to control loading of data into said index counter means and address counter means,
    a decoder circuit connected to an output of said address counter means, said decoder circuit having an output enabling loading of column latch data into a selected configuration memory column.

9. A method for enabling rapid partial configuration reconfigurable device comprising the steps of:
    defining partial configuration requirements including at least the following:
    starting address of configuration data for said partial reconfiguration,
    an information indicative of an end of said configuration data to be loaded in contiguous locations,
    desired configuration data corresponding to said contiguous locations, and
    performing the configuration according to said partial configuration requirements without providing skip commands;
    wherein said configuration is performed by: storing said starting address of configuration data in an address counter, storing said information in an index counter, storing said configuration data in a configuration memory of said configurable device at an address stored in said address counter, incrementing said address counter and decrementing said index counter after storing said configuration data, repeating the above sequence until said index counter value reaches zero.

10. A method according to claim 9, wherein said information is a data size specifying a number of contiguous locations to be reconfigured.

11. A method according to claim 9, wherein said information is an end address of the configuration data for said partial configuration.

12. A method as claimed in claim 9, wherein said partial configuration requirements are defined as a data frame and said starting address, said information and said desired configuration data are fields of said data frame.

13. A method as claimed in claim 9, wherein said starting address of said configuration means corresponds to an address of an initial configuration latch column and said information comprises a number of contiguous latch columns.

14. A configurable circuit, comprising:
    a frame register operable to sequentially receive a first number of frames of configuration data;
    a second number of configuration latches coupled to the frame register, each of the configuration latches having a respective address, the second number being greater than the first number, and
    a latch loader coupled to the configuration latches and operable to select a first number of configuration latches having contiguous addresses and to sequentially load the frames of configuration data from the frame register into the respective first number of the configuration latches without providing skip commands; wherein the latch loader comprises an address counter operable to receive an address of a starting one of the selected configuration latches and to sequentially generate the addresses of the subsequent ones of the selected configuration latches, an index counter operable to receive a count value and to sequentially decrement the count value; and a comparator coupled to the address and index counters and operable to disable the address counter when the count value equals zero.

15. The configurable circuit of claim 14 wherein the latch loader comprises an address counter operable to receive an address of a starting one of the selected configuration latches and to sequentially generate the addresses of the subsequent ones of the selected configuration latches.

16. The configurable circuit of claim 14 wherein the latch loader comprises an address counter operable to receive an address of a starting one of the selected configuration latches and to sequentially generate the addresses of the subsequent ones of the selected configuration latches by incrementing the received address.

17. The configurable circuit of claim 14 wherein the latch loader comprises an address counter operable to receive an address of a starting one of the selected configuration latches and to sequentially generate the addresses of the subsequent ones of the selected configuration latches by incrementing the received address until the incremented address equals an end address.

18. The configurable circuit of claim 14 wherein the latch loader comprises an address counter operable to receive an address of a starting one of the selected configuration latches and to sequentially generate the addresses of the subsequent ones of the selected configuration latches by decrementing the received address.

19. The configurable circuit of claim 14 wherein the latch loader comprises an address counter operable to receive an address of a starting one of the selected configuration latches and to sequentially generate the addresses of the subsequent ones of the selected configuration latches by decrementing the received address until the decremented address equals an end address.

20. The configurable circuit of claim 14 wherein the latch loader comprises:
an address counter operable to receive an address of a starting one of the selected configuration latches and to sequentially generate the addresses of the subsequent ones of the selected configuration latches; and
an index counter operable to disable the address counter after the address counter generates a respective address for a last of the selected configuration latches.

21. The configurable circuit of claim 14 wherein the latch loader comprises:
an address counter operable to receive an address of a starting one of the selected configuration latches and to sequentially generate the addresses of the subsequent ones of the selected configuration latches; and
an index counter operable to receive a count value, to sequentially decrement the count value, and to disable the address counter when the count value equals zero.

22. The configurable circuit of claim 14 wherein the latch loader comprises:
an address counter operable to receive an address of a starting one of the selected configuration latches and to sequentially generate the addresses of the subsequent ones of the selected configuration latches; and
an index counter operable to sequentially increment a count value and to disable the address counter when the count value equals a predetermined number.

23. The configurable circuit of claim 14 wherein the latch loader comprises:
an address counter operable to receive an address of a starting one of the selected configuration latches and to sequentially generate the addresses of the subsequent ones of the selected configuration latches;

an index counter operable to sequentially increment a count value; and
a comparator coupled to the address and index counters and operable to disable the address counter when the count value equals a predetermined number.

24. A field-program gate array comprising: a frame register operable to sequentially receive a first number of frames of configuration data; a second number of configuration latches coupled to the frame register, each of the configuration latches having a respective address, the second number being greater than the first number, an index counter operable to upgrade an index; and an address counter operable to receive an address and to sequentially load the frames of configuration data from the frame register into a first number of respective configuration latches without providing skip commands by sequentially updating the received address until the index equals a predetermined value, the first number of configuration latches having contiguous addresses; wherein the index counter is further operable to receive the index equal to one less than the first number and to sequentially decrement the index; and the address counter is further operable to sequentially load the frames of configuration data from the frame register into the first number of respective configuration latches by sequentially decrementing the received address until the index equals zero.

25. The field-programmable gate array of claim 24 wherein:
the index counter is further operable to receive the index equal to one less than the first number and to sequentially decrement the index; and
the address counter is further operable to sequentially load the frames of configuration data from the frame register into the first number of respective configuration latches by sequentially incrementing the received address until the index equals zero.

26. A method, comprising: receiving a frame of configuration data with a configurable circuit, loading the configuration data into a configuration latch of the configurable circuit; and sequentially repeating the receiving and loading for a subsequent configuration latch of the configurable circuit without providing skip commands, the configuration latch and subsequent configuration latch respectively located at contiguous addresses and being fewer than all of the configuration latches composing the configurable circuit; wherein the loading comprises receiving the address of the configuration latch; and the repeating comprises generating the address of the subsequent configuration latch by decrementing the address of the configuration latch.

27. The method of claim 26 wherein the configurable circuit comprises a field-programmable gate array.

28. The method of claim 26 wherein:
the loading comprises receiving the address of the configuration latch; and
the repeating comprises generating the address of the subsequent configuration latch from the address of the configuration latch.

29. The method of claim 26 wherein:
the loading comprises receiving the address of the configuration latch; and
the repeating comprises generating the address of the subsequent configuration latch by incrementing the address of the configuration latch.

30. A method, comprising: receiving a frame of configuration data with a configurable circuit, loading the configuration data into a configuration latch of the configurable circuit; and sequentially repeating the receiving and loading for subsequent configuration latches of the configurable circuit without providing skip commands, the configuration latch and subsequent configuration latches respectively located at contiguous addresses and being fewer than all of the configuration latches composing the configurable circuit; wherein the loading comprises receiving the address of the configuration latch and an index equal to the number of the subsequent configuration latches, and the repeating comprises decrementing the index and sequentially generating the addresses of the subsequent configuration latches from the address of the configuration latch until the index equals zero.

31. The method of claim 30 wherein:
the loading comprises receiving the address of the configuration latch and an index equal to the number of the subsequent configuration latches; and
the repeating comprises updating the index and sequentially generating the addresses of the subsequent configuration latches from the address of the configuration latch until the index equals a predetermined value.

32. The method of claim 30 wherein:
the loading comprises receiving the address of the configuration latch and an index equal to the number of the subsequent configuration latches; and
the repeating comprises upgrading the index and sequentially generating the addresses of the subsequent configuration latches by incrementing the address of the configuration latch until the index equals a predetermined value.

33. The method of claim 30 wherein:
the loading comprises receiving the address of the configuration latch and an index equal to the number of the subsequent configuration latches; and
the repeating comprises upgrading the index and sequentially generating the addresses of the subsequent configuration latches by decrementing the address of the configuration latch until the index equals a predetermined value.

34. The method of claim 30 wherein:
the loading comprises receiving the address of the configuration latch and an index equal to the number of the subsequent configuration latches; and
the repeating comprises incrementing a count value and sequentially generating the addresses of the subsequent configuration latches from the address of the configuration latch until the count value equals the index.

* * * * *

UNITED STATES PATENT AND TRADEMARK OFFICE
CERTIFICATE OF CORRECTION

| | | |
|---|---|---|
| PATENT NO. | : 7,206,919 B2 | Page 1 of 1 |
| APPLICATION NO. | : 10/319436 | |
| DATED | : April 17, 2007 | |
| INVENTOR(S) | : Ashish Kumar Goel and Manish Agarwal | |

It is certified that error appears in the above-identified patent and that said Letters Patent is hereby corrected as shown below:

Column 8 Line 8 please enter --of a-- after "configuration"

Signed and Sealed this

Twenty-first Day of August, 2007

JON W. DUDAS
*Director of the United States Patent and Trademark Office*

UNITED STATES PATENT AND TRADEMARK OFFICE
CERTIFICATE OF CORRECTION

PATENT NO. : 7,206,919 B2  
APPLICATION NO. : 10/319436  
DATED : April 17, 2007  
INVENTOR(S) : Ashish Kumar Goel et al.

It is certified that error appears in the above-identified patent and that said Letters Patent is hereby corrected as shown below:

In column 10, line 6, in Claim 24, delete "field-program" and insert -- field-programmable --, therefor.

Signed and Sealed this

Thirtieth Day of September, 2008

JON W. DUDAS  
*Director of the United States Patent and Trademark Office*